United States Patent [19]
Abe et al.

[11] Patent Number: 5,760,432
[45] Date of Patent: Jun. 2, 1998

[54] THIN FILM STRAINED LAYER FERROELECTRIC CAPACITORS

[75] Inventors: Kazuhide Abe; Shuichi Komatsu; Kazuhiro Eguchi; Takashi Kawakubo, all of Kanagawa-ken, Japan

[73] Assignee: Kabushiki Kaisha Toshiba, Kawasaki, Japan

[21] Appl. No.: 418,299

[22] Filed: Apr. 7, 1995

[30] Foreign Application Priority Data

May 20, 1994 [JP] Japan .................................. 6-106449

[51] Int. Cl.$^6$ ................................................. H01L 27/108
[52] U.S. Cl. .................................... 257/295; 361/321.5
[58] Field of Search ......................... 257/295; 361/321.5

[56] References Cited

U.S. PATENT DOCUMENTS

| | | | |
|---|---|---|---|
| 5,155,573 | 10/1992 | Abe et al. | 257/295 |
| 5,297,077 | 3/1994 | Imai et al. | 365/145 |
| 5,400,275 | 3/1995 | Abe e tal. | 365/145 |
| 5,406,445 | 4/1995 | Fujii | 257/295 |
| 5,471,364 | 11/1995 | Summerfelt | 257/295 |
| 5,576,564 | 11/1996 | Satoh et al. | 257/295 |

OTHER PUBLICATIONS

Yamaka et al., Structural, Ferroelectric, and Pyroelectric Properties of Highly c-axis Oriented $Pb_{1-x}Ca_xTiO_3$ Thin Film Grown by Radio–Frequency Magnetron Sputtering, J. Vac. Sci. Technol. A, Sep./Oct. 1988.

Hikaru Terauchi et al; "Structural Study of Epitaxial $BaTiO_3$ Crystals", Journal of the Physical Society of Japan, vol. 61, No. 7, pp. 2194–2197 Jul. 1992.

Kenji Iijima et al., Japan Applied Physics vol. 62, No. 12, pp. 1250–1251 Dec. 1993.

K. Iijima et al., "Preparation of ferroelectric $BaTio_3$ thin films by activated rective evaporation", Applied Physics Letters, vol. 56, No. 6, pp. 527–529, Feb. 5, 1990.

*Primary Examiner*—Jerome Jackson
*Attorney, Agent, or Firm*—Finnegan, Henderson, Farabow, Garrett & Dunner, L.L.P.

[57] ABSTRACT

A capacitor having a first electrode and a dielectric material epitaxially deposited on a surface of the electrode to form a dielectric layer on the electrode. The dielectric material forming the dielectric layer has induced strain in the layer sufficient to significantly improve the dielectric properties. A second electrode is placed on the dielectric layer.

20 Claims, 15 Drawing Sheets

X :20MV/ndiv
Y :0.1C/m²div

X :20MV/ndiv
Y :0.1C/m²div

X :20MV/mdiv
Y :0.1C/m²div

X :20MV/mdiv
Y :0.1C/m²div

THIN FILM STRAINED LAYER FERROELECTRIC CAPACITORS

BACKGROUND OF THE INVENTION

The present invention relates to thin film capacitors and semiconductor devices including the thin film capacitors.

Semiconductor nonvolatile memory devices including ferroelectric capacitors are known. These devices can store information as a direction of residual polarization of ferroelectric layers provided in the capacitors structure.

Dielectric materials change from being ferroelectric to paraelectric at the Curie temperature. Therefore, the Curie temperature would limit the operational temperature of an electronic device using a dielectric material that should be ferroelectric. In other words, materials having a high Curie temperature are desirable for electronic devices using the ferroelectric property of the material.

Lead titanate zirconate (PZT) solid solutions comprised of lead titanate ($PbTiO_3$) and lead zirconate ($PbZrO_3$) are ferroelectric. Because PZT also has a high curie temperature from 230° C. to 490° C., PZT has been used in such electronic devices.

In order to obtain the ferroelectric perovskite phase, high temperature (e.g., 500° C. or more) is required. However, the lead (Pb) component of PZT easily evaporates at such high temperatures. Therefore, it is difficult to form ferroelectric PZT as a thin film. If PZT is formed at lower temperatures, an amorphous phase or a pyrochlore phase that is not ferroelectric would be formed.

Barium titanate ($BaTiO_3$) is also a ferroelectric material, however, barium titanate has a Curie temperature at 120° C. The Curie temperature of $BaTiO_3$ is too close to a temperature at which electronic devices normally operate about 85° C. Therefore, barium titanate is not suitable for use as a ferroelectric thin film at the operating temperature of electronic devices.

Recently, Japanese Applied Physics vol. 62, No. 12, 1993, pp. 1250–1251 described barium titanate thin films with thickness of 60 nm or lower, epitaxially grown on a Pt/MgO substrate, could exhibit higher Curie temperatures than conventional barium titanate when the Curie temperature is measured using bulk barium titanate. The remanent polarization of the thin film material was, however, less than about 3 μC/cm². This is not enough to be used as a capacitor for nonvolatile memory in a semiconductor device.

Paraelectric materials providing perovskite crystal structure, such as strontium titanate ($SrTiO_3$) or calcium titanate ($CaTiO_3$), are expected to have high dielectric constants which would be used as a capacitor in semiconductors instead of silicon oxide or silicon nitride. However, the dielectric constants of thin films are smaller than the expected values. Therefore, these paraelectric materials have not been put into practical use.

SUMMARY OF THE INVENTION

Accordingly, an object of the present invention is to provide a thin film capacitor having a high Curie temperature.

Another object of the present invention is to provide a thin film capacitor having a large remanent polarization.

Another object of the present invention is to provide a thin film capacitor wherein change of the remanent polarization with temperature is small.

The present invention provides a thin film capacitor comprising a substrate having a conductive surface, a dielectric layer on the conductive surface having a lattice parameter $c_e$ in the thickness direction and comprised of a dielectric perovskite material having an original lattice constant $c_o$, where $c_e/c_o$ is about 1.02 or more.

The present invention further provides a thin film capacitor comprising a substrate having a conductive surface consisting essentially of one of the planes of a cubic material or the (001) plane of a tetragonal material, the plane having a lattice constant $a_s$. A dielectric layer of a dielectric perovskite material is on the conductive surface. The dielectric perovskite material has a Curie temperature of about 150° C. or less and a lattice constant $a_o$ satisfying the relation of $1.002 \leq a_o a_s \leq 1.015$. An electrode layer is on the dielectric layer.

The present invention further provides a thin film capacitor comprising a substrate having a conductive surface consisting essentially of one of the planes of a cubic material or the (001) plane of a tetragonal material. The plane has a lattice constant $a_s$. A dielectric layer of a dielectric perovskite material is on the conductive surface. The dielectric perovskite material comprising at least one material represented by the formula of $ABO_3$, wherein "A" is at least one of Ba, Sr and Ca, "B" is at least one of Ti, Zr, Hf, Sn, ($Mg_{1/3}Nb_{2/3}$), $Mg_{1/3}Ta_{2/3}$), ($Zn_{1/3}Nb_{2/3}$), ($Zn_{1/3}Ta_{2/3}$), ($Mg_{1/2}Te_{1/2}$), ($Co_{1/2}W_{1/2}$), ($Mg_{1/2}W_{1/2}$), ($Mn_{1/2}W_{1/2}$), ($Sc_{1/2}Nb_{1/2}$), ($Mn_{1/2}Nb_{1/2}$), ($Sc_{1/2}Ta_{1/2}$), ($Fe_{1/2}Nb_{1/2}$), ($In_{1/2}Nb_{1/2}$), ($Fe_{1/2}Ta_{1/2}$), ($Cd_{1/3}Nb_{2/3}$), ($Co_{1/3}Nb_{2/3}$), ($Ni_{1/3}Nb_{2/3}$), ($Co_{1/3}Ta_{2/3}$) and ($Ni_{1/3}Ta_{2/3}$). The dielectric perovskite material has a lattice constant $a_o$ and the combination satisfies the relation $1.002 \leq a_o/a_s \leq 1.015$. An electrode layer is on the dielectric layer.

The present invention is also a semiconductor device including the above-mentioned capacitor. For example, such a semiconductor device comprises plural memory cells including a transistor, and the above-mentioned capacitor connected to the transistor so as to be charged corresponding to data. The device further includes a reader for reading the data from a specified memory cell, and a writer for writing the data to a specified memory cell.

3

Figure 10:
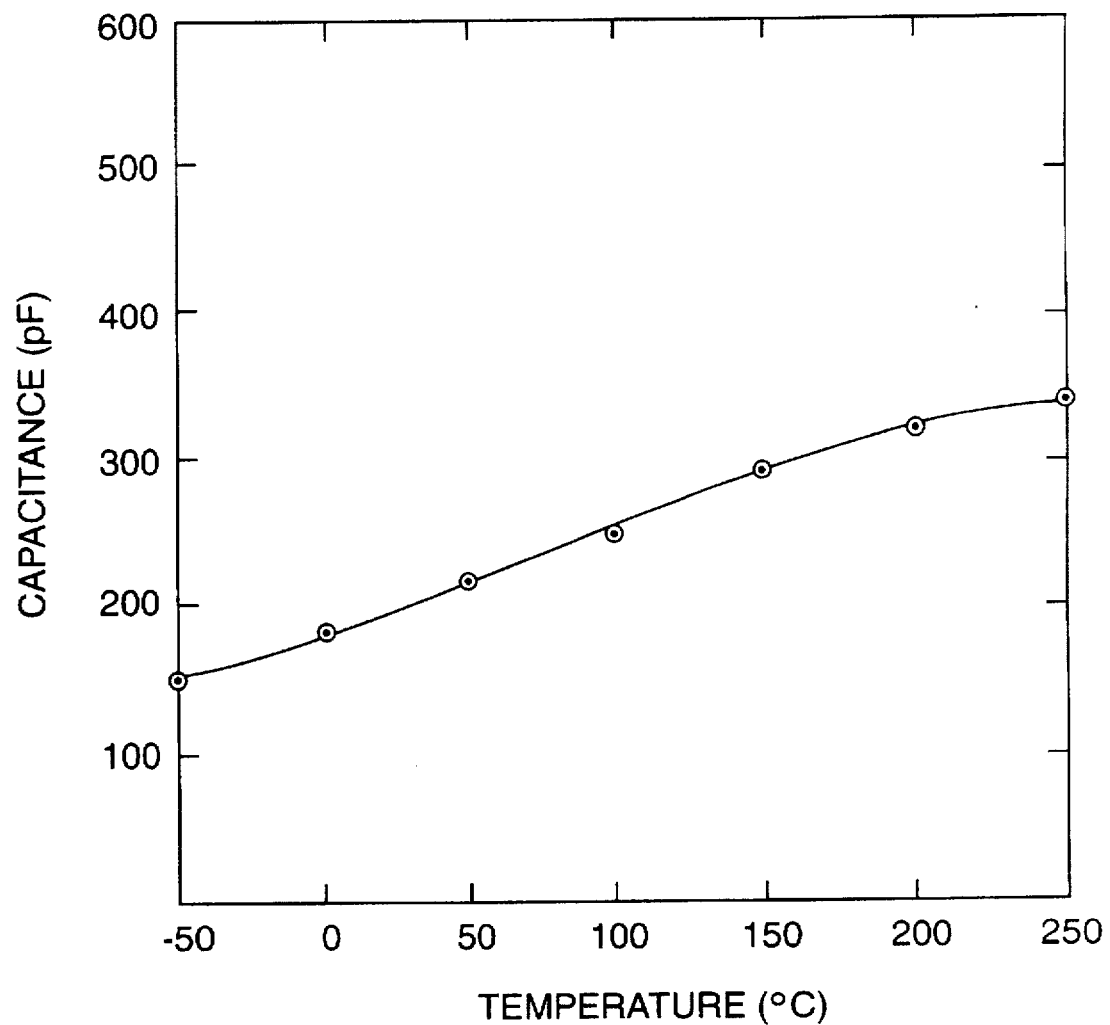
Figure 11A:
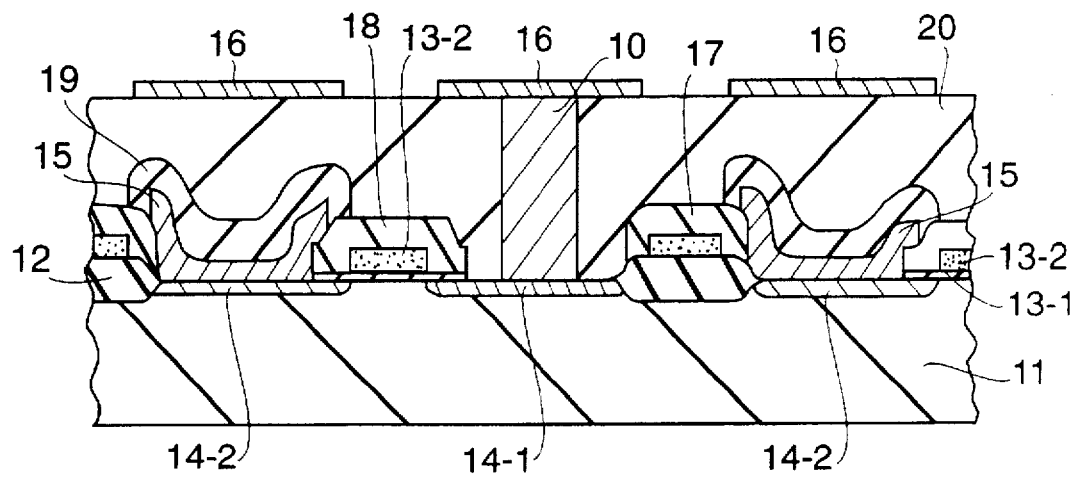
Figure 11B:
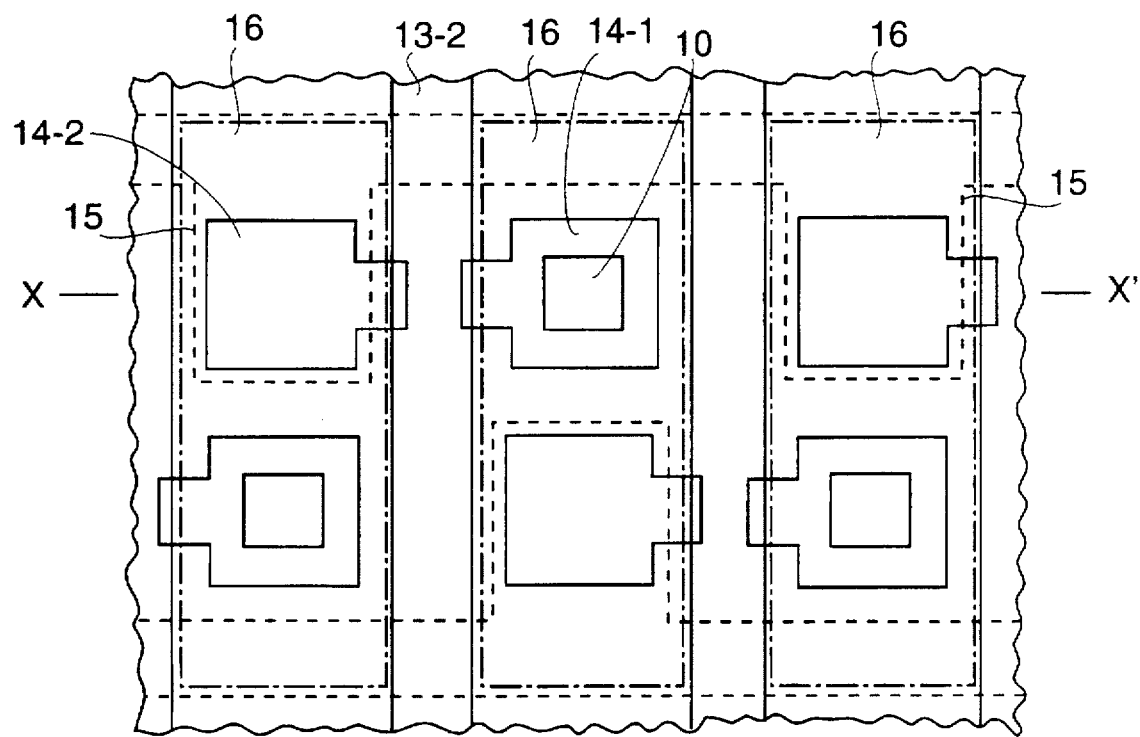
Figure 12A:
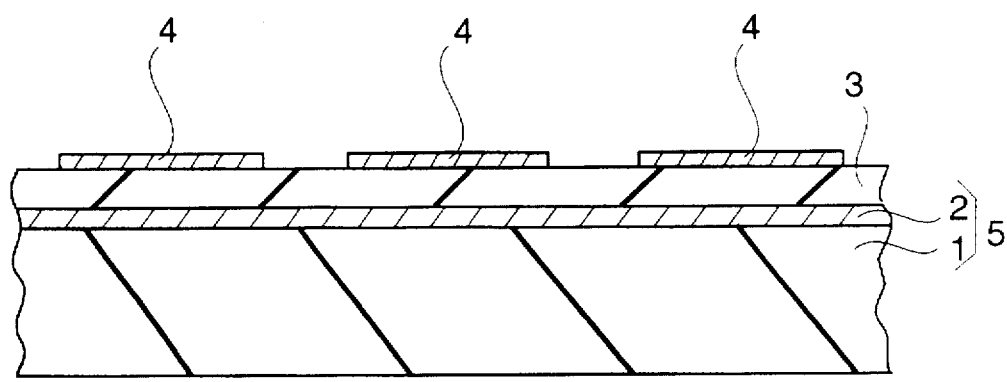
Figure 12B:
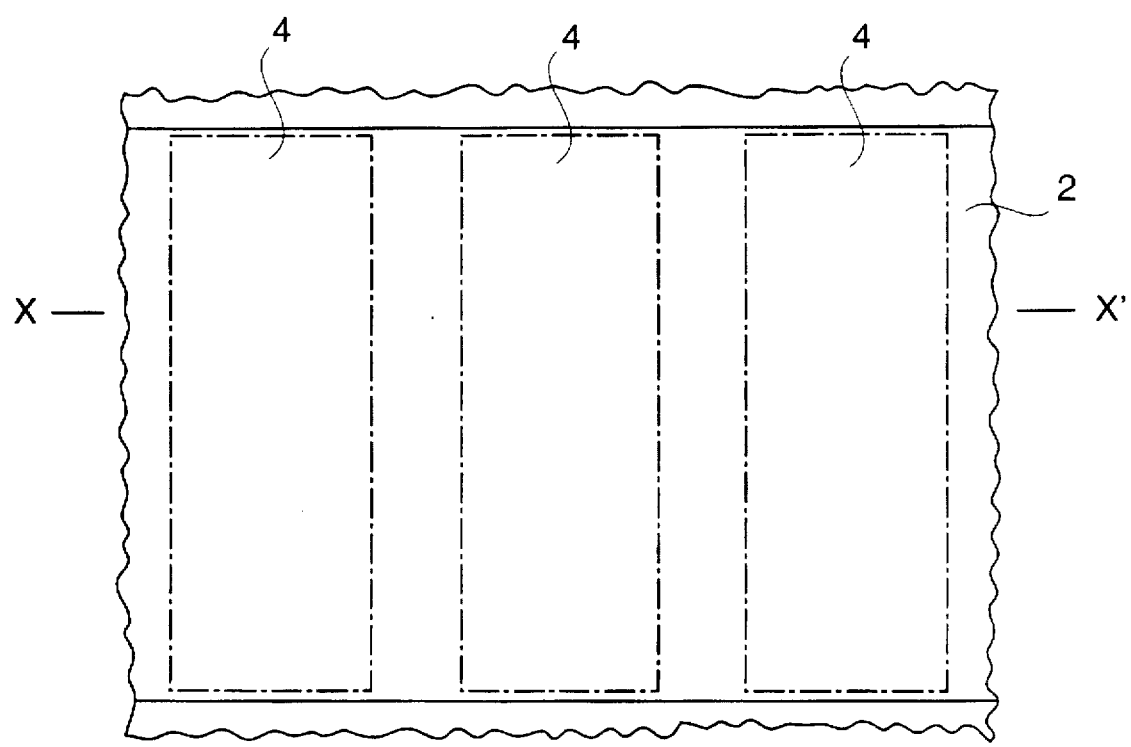
Figure 13:
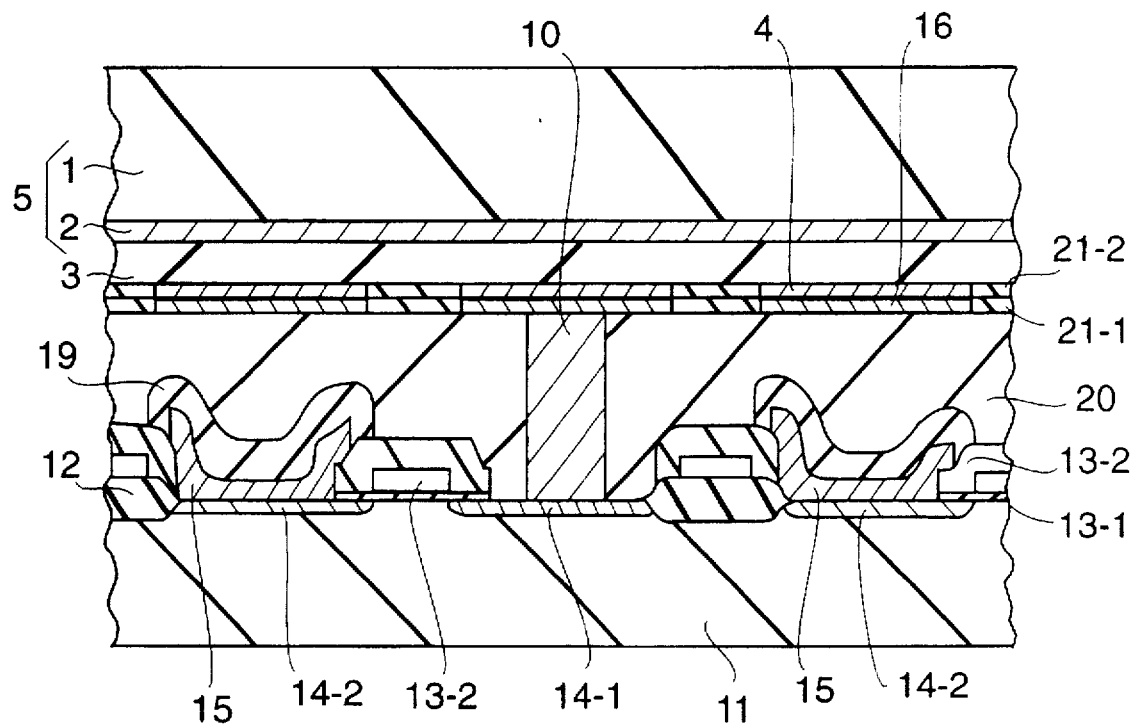
Figure 14:
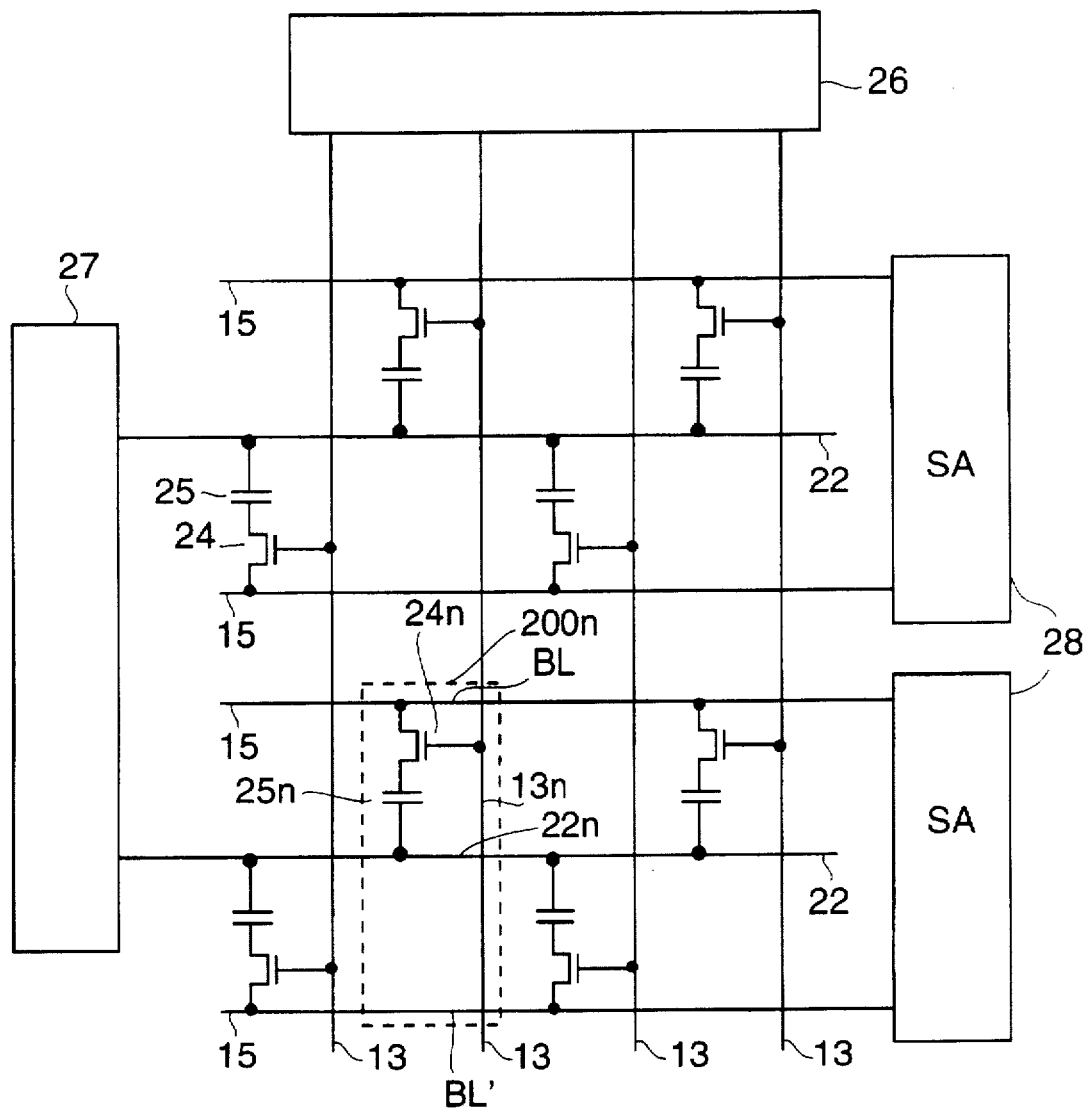

FIG. 10 is a graph showing the temperature dependences of the capacitance of Example 3;

FIG. 11(a) is a cross-sectional view taken along line X-X' of FIG. 11(b) of MOS transistors of Example 4;

FIG. 11(b) is a plan view of MOS transistors of FIG. 11(a);

FIG. 12(a) is a cross-sectional view taken along line X-X' of FIG. 12(b) of ferroelectric capacitors of Example 5;

FIG. 12(b) is a plan view of ferroelectric capacitors of FIG. 12(a);

FIG. 13 is a cross-sectional view of the semiconductor memory device of Example 5;

FIG. 14 is an equivalent circuit of Example 4; and

Figure 15:
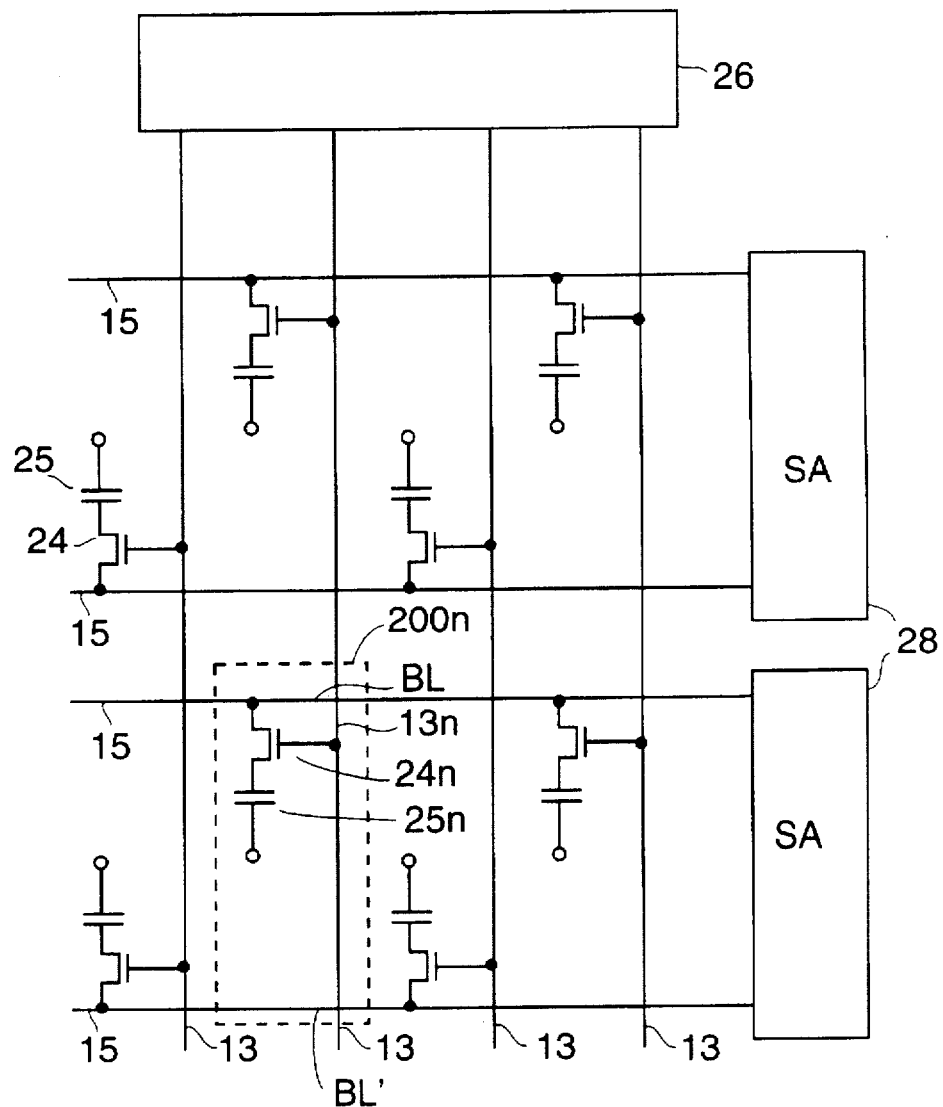

FIG. 15 is an equivalent circuit of a semiconductor memory device of Example 5.

DETAILED DESCRIPTION OF THE PREFERRED EMBODIMENTS

The present invention is directed to dielectric materials which are readily formed into a thin film configuration and having a high Curie temperature. Barium titanate is not desirable because its Curie temperature is low. Materials such as barium strontium titanate $(Ba_xSr_{1-x})TiO_3$ ($0.30 \leq x \leq 0.90$) epitaxially grown on (001) oriented Pt formed on (001) surface of a MgO single crystal have a high Curie temperature. To obtain a high Curie temperature ($T_c$), such materials should have the following relation between the lattice constants $a_s$ and $a_o$:

$$1.002 \leq a_o/a_s \leq 1.015$$

$a_s$: a-axis lattice constant of the surface of the substrate $a_o$: original a-axis lattice constant of the dielectric material In other words, when the original lattice constant $a_o$ is sufficiently larger than the lattice constant $a_s$, a dielectric layer having a high $T_c$ can be obtained.

As used herein the term lattice constant refers to a distance in a crystalline lattice that is a characteristic of the material in the bulk state. When the term lattice parameter is used it refers to a distance in a crystalline lattice that has been affected by the strain induced within the crystalline material.

It is believed that since the lattice constant $a_o$ is shortened by epitaxial growth on the surface having the lattice constant $a_s$, the c-axis lattice parameter $c_e$ of the dielectric layer is consequently lengthened compared to the original c-axis lattice constant $c_o$ of the dielectric material. This effect is believed to be due to introduced strain. Therefore, the Curie temperature $T_c$ of a particular dielectric layer can be raised. In order to sufficiently raise Curie temperature, the ratio of $c_e/c_o$ is preferably about 1.02 or more.

Excessive $a_o/a_s$ causes the dielectric layer to have dislocations due to misfits at the interface between the dielectric layer and the substrate. As a result, sufficient strain cannot be introduced into the dielectric layer, and $T_c$ does not rise sufficiently. Deficient $a_o/a_s$ also cannot introduce the sufficient strain into the dielectric layer. Thus, the relation of $a_o$ to as should be $1.002 \leq a_o/a_s \leq 1.015$, preferably $1.002 \leq a_o/a_s \leq 1.011$.

As a result, for example, a dielectric material having $T_c$ lower than room temperature, i.e., a paraelectric material, may become ferroelectric by such epitaxial growth.

Barium titanate ($BaTiO_3$) has a Curie temperature of about 120° C., and strontium titanate ($SrTiO_3$) has no Curie

4 temperature, even if it is cooled below 4 K. When formed into a solid solution, barium strontium titanate $(Ba_xSr_{1-x})TiO_3$ with a composition range of $0 \leq x \leq 0.70$ has a Curie temperature lower than room temperature. Thus, the bulk of $(Ba_xSr_{1-x})TiO_3$ ($0 \leq x \leq 0.70$) is in a phase that is paraelectric at room temperature, i.e., 20° C.

However, according to the present invention, thin films of $(Ba_xSr_{1-x})TiO_3$ with Ba content of $0.30 \leq x \leq 0.70$ formed on a suitable substrate satisfying $1.002 \leq a_o/a_s \leq 1.015$, exhibit ferroelectric behavior at room temperature. In other words, a ferroelectric thin film can be realized by using a normally paraelectric material.

The present invention is not limited such a case in which ferroelectric behavior is realized in a thin film of paraelectric material. For example, whereas $(Ba_xSr_{1-x})TiO_3$ with Ba content of $0.70<x \leq 1.0$ is originally ferroelectric at room temperature, a thin film of $(Ba_xSr_{1-x})TiO_3$ ($0.70<x \leq 0.90$) formed on a suitable substrate satisfying $1.002 \leq a_o/a_s \leq 1.015$ exhibits ferroelectricity with a Curie temperature which is higher than the original value.

In the present invention, an original Curie temperature of the dielectric material, which is a unique value for a bulk with a given composition, is preferably about 150° C. or lower, more preferably within a range of from about $-150°$ C. to about 20° C. Since the dielectric material having $T_c$ of 150° C. or lower generally provides small spontaneous strain in lattice, the strain induced by the method of the present invention is effective to raise $T_c$.

On the other hand, the dielectric material having $T_c$ more than 150° C. generally provides large spontaneous strain in lattice. When a thin film of high Curie temperature dielectric material is formed, the thin film tends to have plural domains in which different directions of spontaneous polarization exist. It is observed that even a single crystal of ferroelectric material have such domains. Therefore, the induced strain into the lattice by epitaxial growth is easily cancelled and, consequently, $T_c$ does not rise as much. Also, if the thin dielectric film has plurality of polarization regions (region where the polarization direction is 90° different), the ferroelectric property would be deteriorated by plural repeats of reversing the polarization. Further, typical ferroelectric materials having $T_c$ of more than 150° C. contain lead (Pb) or bismuth (Bi) as main components. Since lead and bismuth are elements which readily evaporate during deposition for epitaxial growth, the ratio of components is difficult to control and, therefore, the dielectric properties are not easily reproducible. Furthermore, since such dielectric materials already have high Curie temperatures, the rise of Curie temperature is not so effective to improve ferroelectric properties. Therefore, in this invention, a dielectric material preferably has a Curie temperature of about 150° C. or less.

The present invention is not limited to $(Ba_xSr_{1-x})TiO_3$. The present invention is also operable for dielectric materials satisfying the relation of $1.002 \leq a_o/a_s \leq 1.015$, such as dielectric materials represented by the formula of $ABO_3$, wherein "A" is at least one of Ba, Sr and Ca, "B" is at least one of Ti, Zr, Hf, Sn, $(Mg_{1/3}Nb_{2/3})$, $(Mg_{1/3}Ta_{2/3})$, $(Zn_{1/3}Nb_{2/3})$, $(Zn_{1/3}Ta_{2/3})$, $(Mg_{1/2}Te_{1/2})$, $(Co_{1/2}W_{1/2})$, $(Mg_{1/2}W_{1/2})$, $(Mn_{1/2}W_{1/2})$, $(Sc_{1/2}Nb_{1/2})$, $(Mn_{1/2}Nb_{1/2})$, $(Sc_{1/1}Ta_{1/2})$, $(Fe_{1/2}Nb_{1/2})$, $(In_{1/2}Nb_{1/2})$, $(Fe_{1/2}Ta_{1/2})$, $(Cd_{1/3}Nb_{2/3})$, $(Co_{1/3}Nb_{2/3})$, $(Ni_{1/3}Nb_{2/3})$, $(Co_{1/3}Ta_{2/3})$, or $(Ni_{1/3}Ta_{2/3})$.

In the present invention, the dielectric perovskite materials may contain impurities or some dopants to improve the properties such as Mn, Sb, Co, Fe, or oxides of those elements. Further, a slight variation from the stoichiometry ratio may be tolerable.

These dielectric materials are free from Pb and Bi which readily evaporate. The oxides of the elements in the above materials provide high melting points. i.e.. at least about 1000° C. Therefore. the elements do not readily evaporate during film forming. at temperatures of about 600° C. or less. As a result. the ratio of the elements of the dielectric material can be readily controlled.

Further. since atomic weights of Ba. Sr and Ca are smaller than that of Pb and Bi. such dielectric materials represented by the formula of $ABO_3$ wherein "A" is at least one of Ba. Sr and Ca. would provide high thermal conductivity. Ferroelectric memory cells require frequently polarization reversing operation which accompanies heat generation. Therefore. high thermal conductivity increases the reliability of such a memory device.

The present invention is not limited in such a case. in which ferroelectricity is induced in thin films made of materials in paraelectric state. When a thin film of a paraelectric material is still paraelectric after induced strain. the dielectric constant of the thin film is larger than the original dielectric constant of the bulk material.

In the present invention. the surface of the substrate preferably provides a cubic crystal structure. Further. the surface of the substrate is preferably the (001) plane. the (110) plane or the (111) plane of the cubic material. i.e. low order planes. because the dielectric material is easy to epitaxially grow on the substrate of such cubic materials. most preferably the (001) plane of cubic materials.

However. the (001) plane of tetragonal materials can be used as substantially the same as (001) plane of cubic materials.

Further. the surface of the substrate should fill the role of the bottom electrode of the capacitor. Therefore. the surface of the substrate should be electrically conductive.

Metal. e.g.. platinum (Pt). can be used as the substrate. Also. electrically conductive nonmetallic compositions. e.g.. electrically conductive perovskite compositions. can be used. For example. Nb-doped barium strontium titanate $(Ba_xSr_{1-x})TiO_3$ ($0<x \leq 1$) can be used.

A substrate having a conductive layer of such a metal. such as Pt. on a structural substrate so as to provide a surface of cubic materials or the (001) plane of tetragonal materials. can be also used. As the structural substrate. single crystal of MgO. single crystal strontium titanate and the like can be used.

Since the conductive layer on the structural substrate is required to be cubic or to have the (001) plane of tetragonal material. the surface of the structural substrate is preferably cubic. e.g.. (001) plane of cubic materials. or (001) plane of tetragonal materials. Further. the a-axis lattice constant $a_{so}$ of the structural substrate also preferably satisfies the relation of $1.002 \leq a_o a_{so} \leq 1.015$. Because the conductive layer can easily grow on the structural substrate so as to satisfy the relation of $1.002 \leq a_o/a_s \leq 1.015$.

Further. the thickness of the conductive layer of metal is preferably about 80 nm or less. Excessive thickness causes the conductive layer of metal to plastically deform during epitaxial growth of the dielectric layer on the conductive layer. As a result. induced strain into the dielectric layer is relaxed. and $T_c$ does not rise sufficiently. However. since the conductive layer should fill the role of the bottom electrode. the thickness of the conductive layer is preferably about 50 nm or more.

The thickness of the dielectric layer is preferably about 15 nm or more. more preferably 50 nm or more. further preferably 70 nm or more. Deficient thickness of the dielectric layer causes small remanent polarization or small dielectric constant. Further. the upper and bottom electrodes may easily be short-circuited. Excessive thickness of the dielectric layer makes it difficult to introduce sufficient strain into the lattice of the dielectric layer. Therefore. the thickness of the dielectric layer is preferably about 1 µm or less.

The dielectric layer can be produced by MOCVD. rf-sputtering. or reactive evaporation. A sputtering method using an oxide target is preferable. because a thin film having a sufficient thickness can be obtained with less defects.

Example 1

Figure 1A:
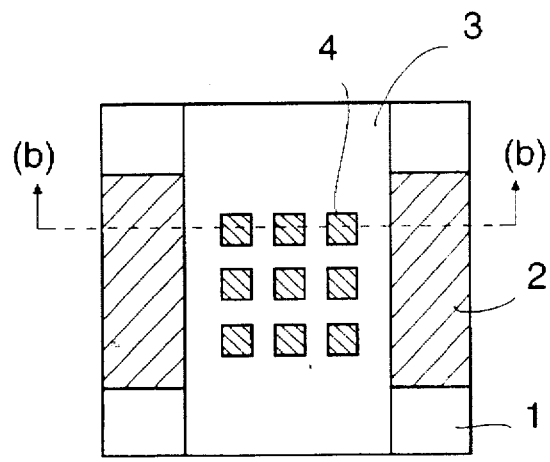
FIG. 1(a) is a plan view of a thin film capacitor of a first embodiment according to the present invention.
Figure 1B:
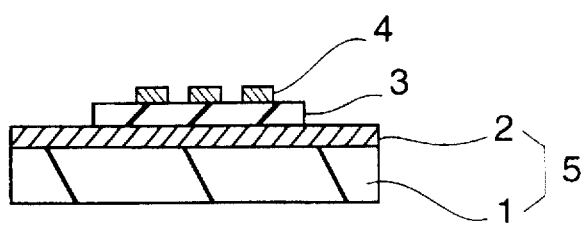
FIG. 1(b) shows a cross-sectional view of the thin film capacitor of FIG. 1(a) taken at (b)

FIG. 1(a) shows a plan view of a thin film capacitor of Example 1 according to the present invention. FIG. 1(b) shows a cross-sectional view of the thin film capacitor of FIG. 1(a).

A structural substrate 1 of (100) single crystal MgO provides a bottom electrode 2 of cubic (100)-oriented Pt. Substrate 1 provides NaCl type crystal structure which has cubic symmetry. Bottom electrode 2 was epitaxially grown on substrate 1 by RF magnetron sputtering. During deposition. the temperature of substrate 1 was held at about 400° C. The lattice constant of MgO is about 0.4213 nm but the lattice constant of bottom electrode 2 was about 0.392 nm. which is substantially the same as an original lattice constant of Pt. The thickness of bottom electrode 2 was about 50 nm. As a result. a substrate 5 having a conductive surface of bottom electrode 2 is obtained.

A dielectric layer 3 of $(Ba_{0.85}Sr_{0.15})TiO_3$ was epitaxially grown on bottom electrode 2 by RF magnetron sputtering where the temperature of the conductive substrate 5 was about 600° C.; the atmosphere was a mixture of Ar and oxygen; and the target was 4-inches in diameter and was sintered $(Ba_{0.85}Sr_{0.15})TiO_3$. The thickness of the dielectric layer was about 230 nm.

Plural upper electrodes 4 were deposited on dielectric layer 3 by RF sputtering and lithography so as to have a size of 0.1×0.1 mm each. Each portion sandwiched by one upper electrode 4 and bottom electrode 2 is one independent capacitor.

It was confirmed that dielectric layer 3 provided the stoichiometric ratio of $(Ba_{0.85}Sr_{0.15})TiO_3$ using ICP (inductively coupled plasma emission spectrometry). The dielectric layer 3 was determined to have been epitaxially grown using RHEED (reflection high-energy electron diffraction).

Also. since the X-ray diffraction pattern of dielectric layer 3 contained only diffraction lines corresponding to (001). (002) and (003) planes of a perovskite crystal structure. dielectric layer 3 was confirmed to provide the (001) plane-oriented perovskite crystal structure.

$(Ba_{0.85}Sr_{0.15})TiO_3$ is normally tetragonal. The original lattice constant $a$ of bulk $(Ba_{0.85}Sr_{0.15})TiO_3$ is about 0.3978 nm. and the lattice constant $a_s$ of bottom electrode 2 of Pt is about 0.39231 nm. The value of $a_o/a_s$ is about 1.013.

The lattice parameter $c_e$ of dielectric layer 3. i.e.. the c-axis lattice constant of epitaxially grown dielectric layer 3. was about 0.417 nm. which was calculated from the (003) X-ray diffraction angle.

The original lattice constant $c_o$ of $(Ba_{0.85}Sr_{0.15})TiO_3$ is about 0.400 nm. Therefore. the lattice parameter $c_e$ of dielectric layer 3 was lengthened and the ratio of $c_e/c_o$ was about 1.042.

It is believed that since the original lattice constant $a_o$ of $(Ba_{0.85}Sr_{0.15})TiO_3$. i.e.. the lattice constant of a-axis of bulk $(Ba_{0.85}Sr_{0.15})TiO_3$. is sufficiently larger than the lattice constant $a_s$ of bottom electrode 2. dielectric layer 3 could be epitaxially grown without dislocations due to misfits. Therefore, the lattice of the perovskite crystal structure in dielectric layer 3 is strained. The lattice is shortened in a plane direction and lengthened in a direction perpendicular to the plane. As a result, the lattice parameter $a_e$ of dielectric layer 3 is shorter than $a_o$ and the lattice constant $c_e$ is longer $c_o$.

Figure 2:
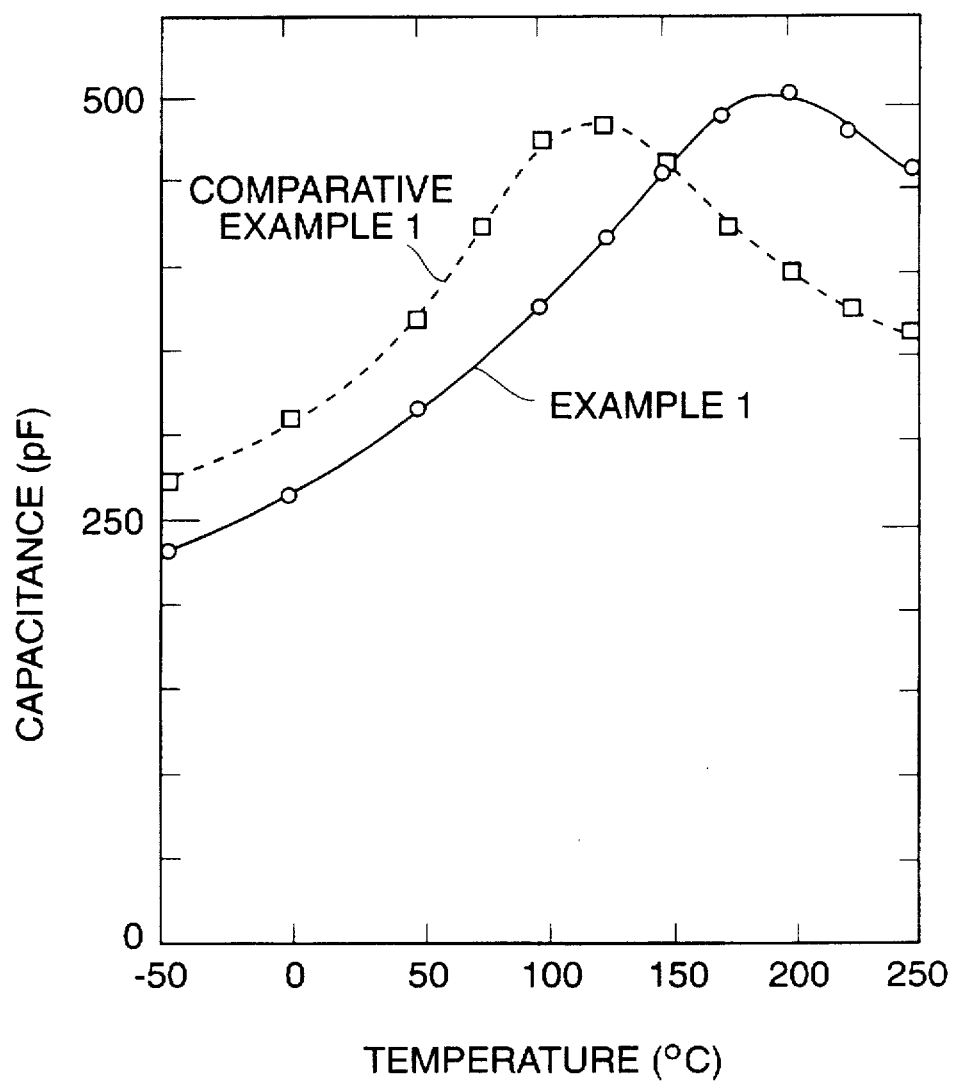
FIG. 2 is a graph showing the temperature dependence of capacitances of Example 1 and Comparative example 1.

FIG. 2 shows the temperature dependence of the capacitance of Example 1 as a continuous line. The capacitance was measured at an AC voltage of an amplitude of 0.1 V and a frequency of 100 kHz. The maximum capacitance was obtained at about 200° C. ($T_{max}$), the Curie temperature.

The original Curie temperature of bulk $(Ba_{0.85}Sr_{0.15})TiO_3$ is about 60° C. Therefore, a higher Curie temperature was obtained according to Example 1.

Figure 3A:
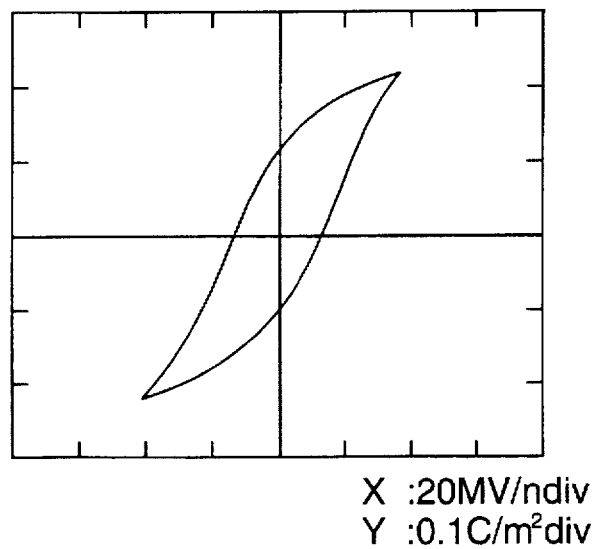
FIG. 3(a) is a graph showing a polarization-electric field hysteresis loop of Example 1.

FIG. 3(a) shows a polarization-electric field hysteresis loop of Example 1 measured by a Sawyer-Tower circuit at an AC voltage of a frequency of 5 kHz at room temperature. The remanent polarization ($P_r$) was about 0.11 C/m², which is sufficient high to practical use.

Comparative example 1

A thin film capacitor was produced by the same method of Example 1 except the dielectric layer 3 was $BaTiO_3$. The properties were measured with the same manner as Example 1.

FIG. 2 shows a temperature dependence of a capacitance of Comparative example 1 as a broken line. $T_{max}$ was about 120° C., i.e., Curie temperature, which is substantially the same as the intrinsic Curie temperature of $BaTiO_3$.

Figure 3B:
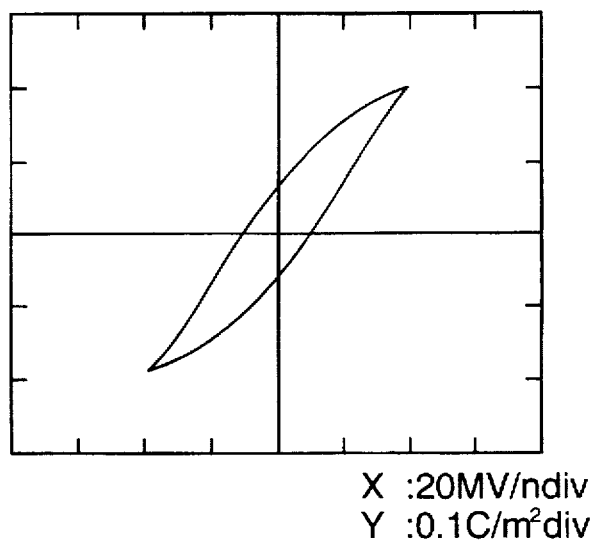
FIG. 3(b) is a graph showing a polarization-electric field hysteresis loop of Comparative example 1.

FIG. 3(b) shows a polarization-electric field hysteresis loop of Comparative example 1. A remanent polarization ($P_r$) was about 0.06 C/m², which is not sufficiently high for practical use.

The original lattice constant $a_o$ of $BaTiO_3$ is about 0.3994 nm, and the lattice constant $a_s$ of bottom electrode 2 of Pt is about 0.39231 nm. The value of $a_o/a_s$ is about 1.018. In other words, $a_o$ is too large to induce sufficient strain in the lattice of dielectric layer 3. As a result, in dielectric layer 3 of Comparative example 2, the lattice of the perovskite crystal structure was not sufficiently strained.

The lattice parameter $c_e$ of dielectric layer 3 was about 0.403 nm, which was the same as the original lattice constant $c_o$ of $BaTiO_3$, i.e., about 0.403 nm. Therefore, the lattice parameter $c_e$ of dielectric layer 3 was not lengthened and the ratio of $c_e/c_o$ was 1.000.

Figure 4:
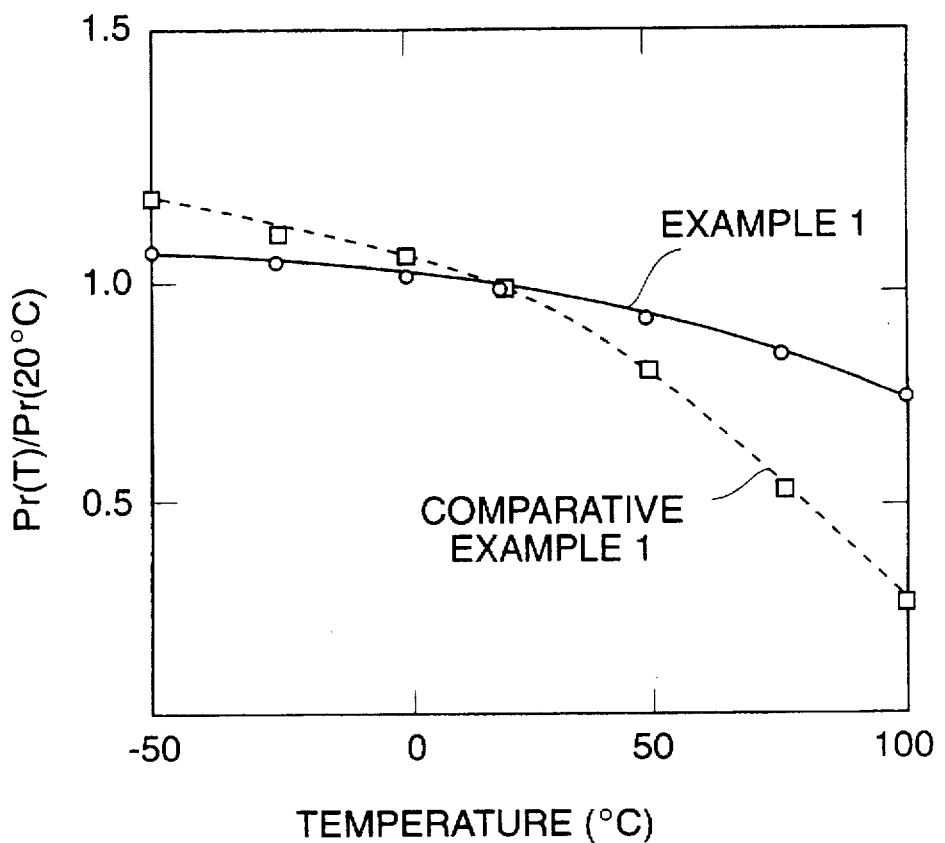
FIG. 4 is a graph showing the temperature dependences of $P_r$ of Example 1 (a continuous line) and Comparative example 1 (a broken line)

FIG. 4 shows the temperature dependences of $P_r$ of Example 1 (a continuous line) and Comparative example 1 (a broken line). In FIG. 4, x-axis shows a ratio of $P_r(T)/P_r(20)$ wherein $P_r(T)$ is a $P_r$ at a temperature T (°C.).

According to FIG. 4, the change of $P_r$ of Example 1 is less than the change of $P_r$ of Comparative example 1. Therefore, Example 1 is superior to Comparative example 1 in the value of $P_r$ and temperature-dependency of $P_r$.

Thus, the thin film capacitor of Example 1 can provide high $P_r$ and good thermal stability of $P_r$.

Example 2

A thin film capacitor was produced by the same method of Example 1 except the dielectric layer 3 was $(Ba_{0.44}Sr_{0.56})TiO_3$. The properties were measured with the same manner as Example 1.

Figure 5:
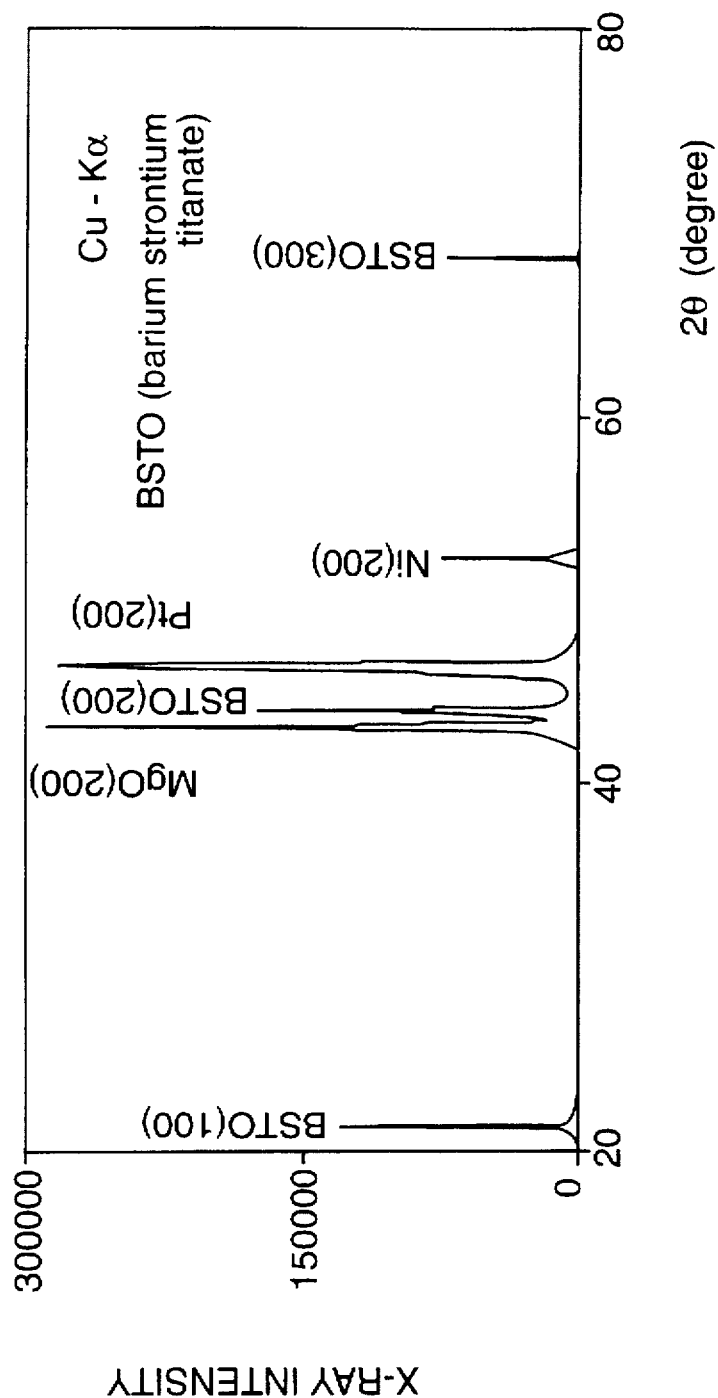
FIG. 5 is an X-ray diffraction pattern of Example 2.

FIG. 5 shows an X-ray diffraction pattern of the dielectric layer 3 of Example 2. Since the X-ray diffraction pattern of dielectric layer 3 contained only diffraction lines corresponding to the (001), (002) and (003) planes of a perovskite crystal structure, dielectric layer 3 was confirmed to provide (001) plane-oriented perovskite crystal structure.

The original crystalline form of $(Ba_{0.44}Sr_{0.56})TiO_3$ is cubic. The original lattice constant $a_o$ of $(Ba_{0.44}Sr_{0.56})TiO_3$ is about 0.3946 nm, and the lattice constant $a_s$ of bottom electrode 2 of $P_t$ is about 0.39231 nm. Therefore, the value of $a_o/a_s$ is about 1.006.

The lattice parameter $c_e$ of dielectric layer 3 was about 0.406 nm, which was calculated from the (003) X-ray diffraction angle.

The original lattice constant $c_o$ of $(Ba_{0.44}Sr_{0.56})TiO_3$ is about 0.3946 nm which is the same as $a_o$. Therefore, the lattice parameter $c_e$ of dielectric layer 3 was lengthened more than $c_o$ and the ratio of $c_e/c_o$ was about 1.028. The reason is believed as the same as Example 1.

Figure 6:
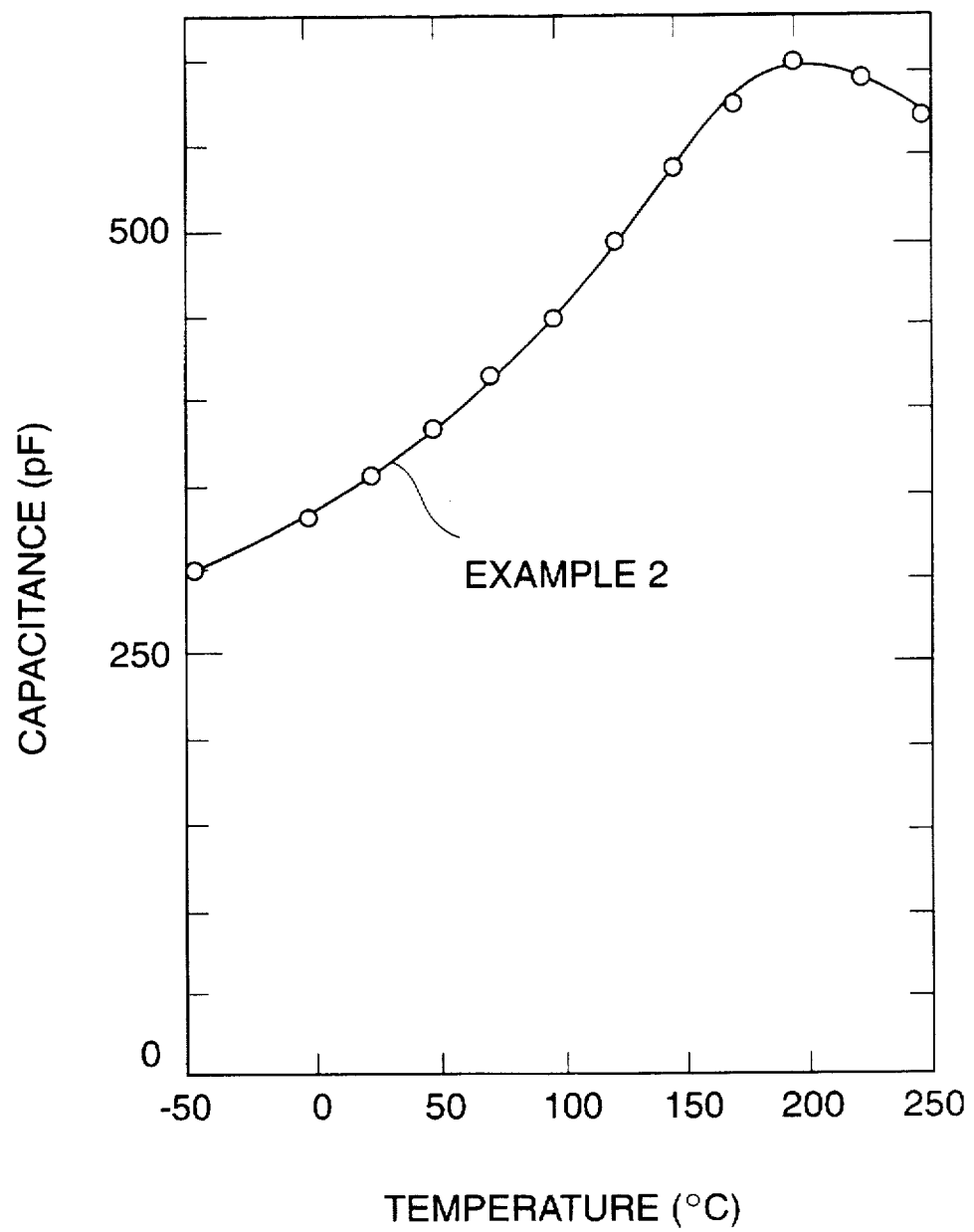
FIG. 6 is a graph showing the temperature dependence of a capacitance of Example 2.

FIG. 6(a) shows a temperature dependence of the capacitance of Example 2 measured with the same method as Example 1. The maximum capacitance was obtained at about 200® C. ($T_{max}$), the Curie temperature.

The intrinsic Curie temperature of $(Ba_{0.44}Sr_{0.56})TiO_3$, i.e., the Curie temperature of bulk $(Ba_{0.44}Sr_{0.56})TiO_3$, is about −40° C. Therefore, bulk $(Ba_{0.44}Sr_{0.56})TiO_3$ is paraelectric at room temperature.

Figure 7A:
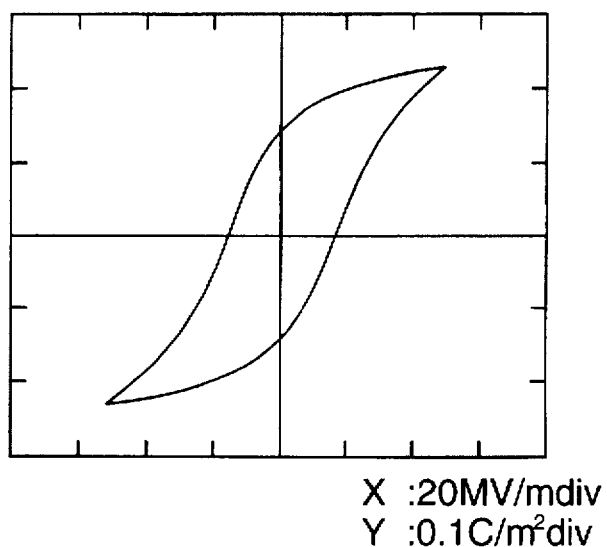
FIG. 7(a) is a graph showing a polarization-electric field hysteresis loop of Example 2.

The Curie temperature of Example 2, i.e., about 200° C., is higher than the intrinsic Curie temperature of the same material, i.e., −40° C. Therefore, the dielectric layer 3 of Example 2 exhibits ferroelectric behavior, even though the bulk material is paraelectric. FIG. 7(a) shows the polarization-electric field hysteresis loop of Example 2 obtained by the same manner as Example 1. In fact, the polarization-electric field hysteresis loop of Example 2 demonstrates that the layer had a remanent polarization, $P_r$.

Comparative example 2

A thin film capacitor of Comparative example 2 was produced by the same method of Example 1 except the dielectric layer 3 was $(Ba_{0.24}Sr_{0.76})TiO_3$. The properties were measured with the same manner as Example 1.

Figure 7B:
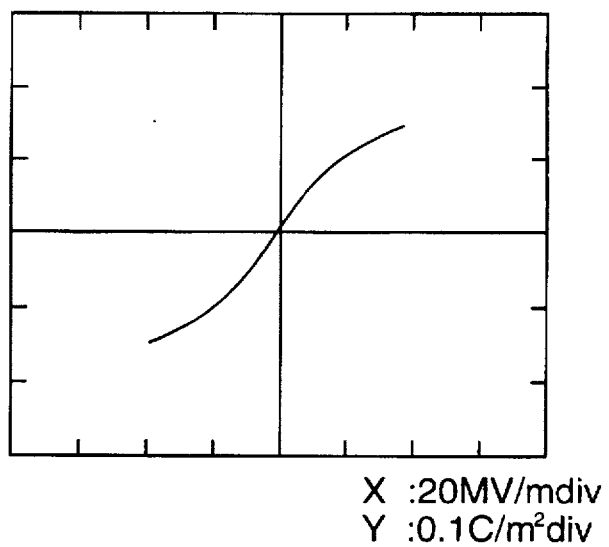
FIG. 7(b) is a graph showing a polarization-electric field hysteresis loop of Comparative example 2.

FIG. 7(b) shows a polarization-electric field hysteresis loop of Comparative example 2. A remanent polarization ($P_r$) does not exist, therefore, dielectric layer 3 of Comparative example 2 is still paraelectric.

The original lattice constant $a_o$ of $(Ba_{0.24}Sr_{0.76})TiO_3$ is about 0.3927 nm, and the lattice constant $a_s$ of bottom electrode 2 of $P_t$ is about 0.39231 nm. The value of $a_o/a_s$ is about 1.001. As a result, in the dielectric layer 3 of Comparative example 2, the lattice of the perovskite crystal structure was not sufficiently strained. The lattice constant $c_e$ was about 0.400 nm and the ratio of $c_e/c_o$ was about 1.018.

Example 3

A thin film capacitor was produced by the same method of Example 2 except the structural substrate 1 was (100) single crystal $SrTiO_3$ doped with 0.5 mol % of Nb (STO—Nb). The single crystal STO—Nb has a cubic crystal structure, and the lattice constant $a_s$ is about 0.3905 nm. Further, since the resistivity of STO—Nb is about 1 ohm-cm, the structural substrate of STO—Nb fills the role of the bottom electrode 2 shown in FIG. 1(b). Therefore, the bottom electrode 2 is omitted. Further, the original lattice constant $a_o$ of $(Ba_{0.44}Sr_{0.56})TiO_3$ is about 0.3946 nm. Therefore, the value of $a_o/a_s$ is about 1.010.

A dielectric layer 3 of $(Ba_{0.44}Sr_{0.56})TiO_3$ was epitaxially formed on the structural substrate 1 by RF magnetron sputtering under the following conditions: the temperature of structural substrate 1 was about 600° C.; the atmosphere was a mixture of Ar and oxygen; and the targets were sintered $BaTiO_3$ and sintered $SrTiO_3$. The thickness of the dielectric layer 3 was about 230 nm.

It was confirmed that the dielectric layer 3 provided the stoichiometry ratio of $(Ba_{0.44}Sr_{0.56})TiO_3$ with the ICP method.

Plural upper electrodes 4 of 100 nm thickness of Ni were formed by RF sputtering and lithography so as to have a size of 0.1×0.1 mm each.

Figure 8:
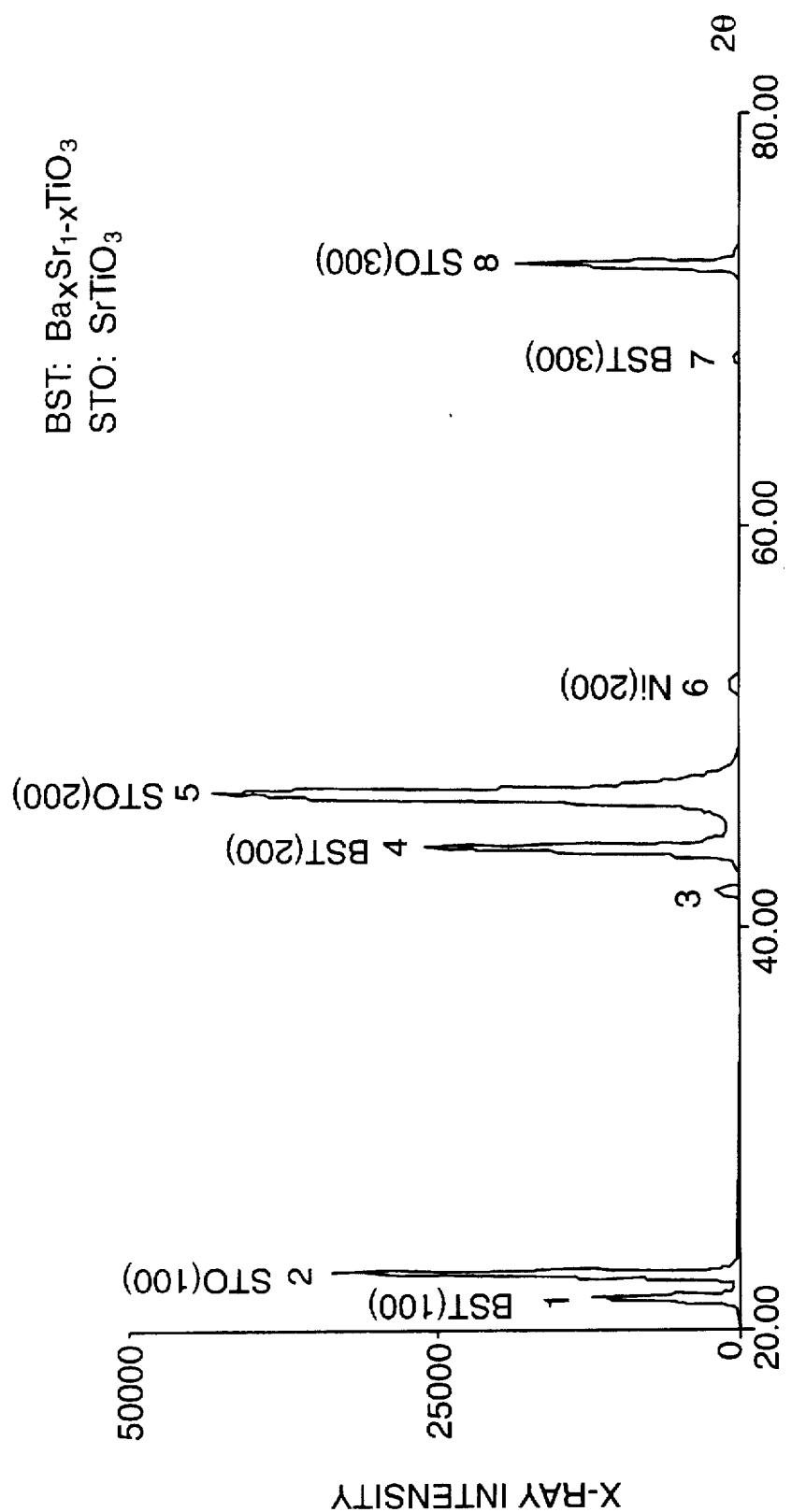
FIG. 8 is an X-ray diffraction pattern of Example 3.

FIG. 8 shows an X-ray diffraction pattern of dielectric layer 3 of Example 3. Since the X-ray diffraction pattern of dielectric layer 3 contained only diffraction lines corresponding to (001), (002) and (003) planes of a perovskite crystal structure, dielectric layer 3 was confirmed to have the (001) plane-oriented perovskite crystal structure.

The lattice parameter $c_e$ of dielectric layer 3 was about 0.4125 nm, which was calculated from the (003) X-ray diffraction angle. The original lattice constant $c_o$ of $(Ba_{0.44}Sr_{0.56})TiO_3$ is about 0.3946 nm. Therefore, the lattice constant c of dielectric layer 3 was lengthened and the ratio of $c_e/c_o$ was about 1.045. The reason is believed as the same as Example 1.

Figure 9:
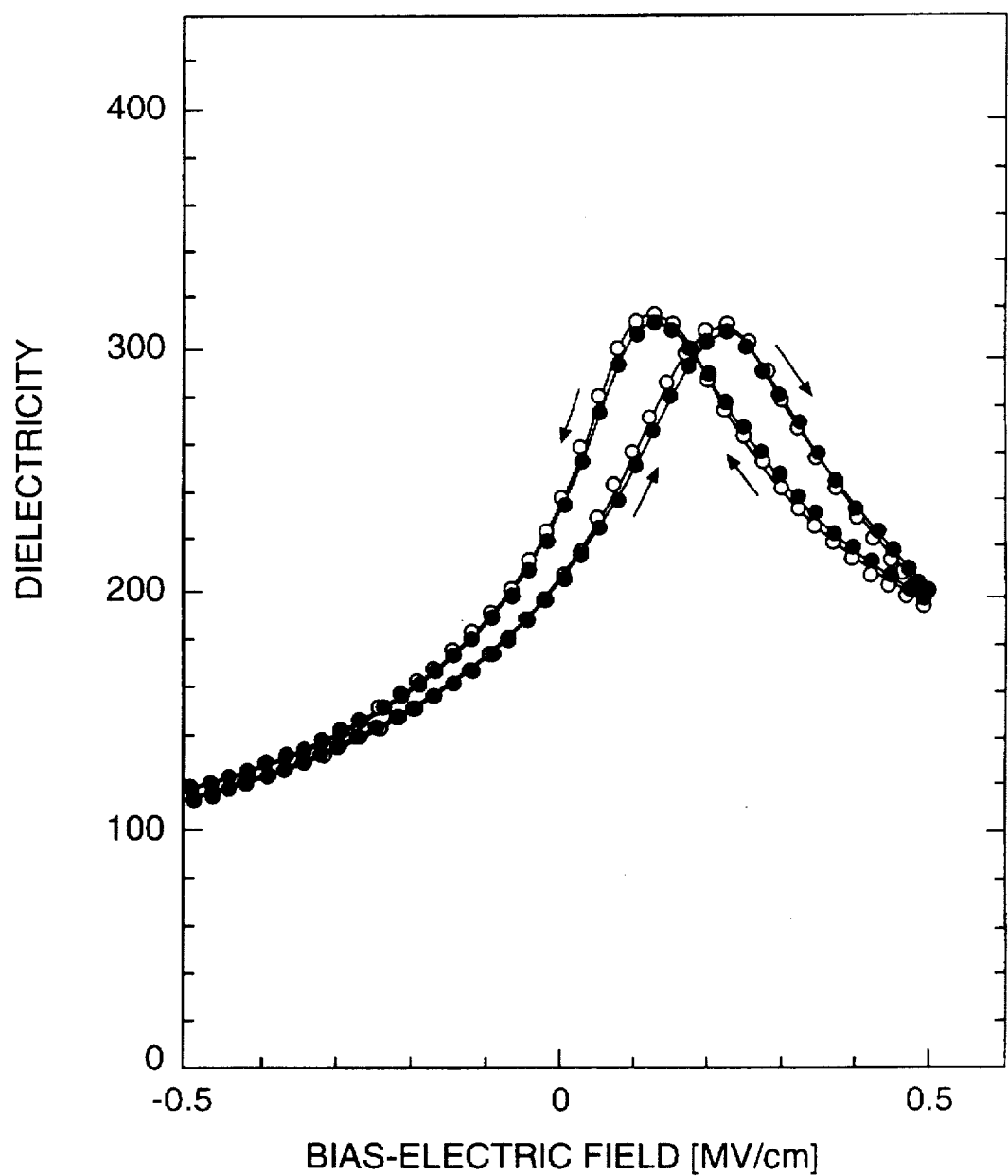
FIG. 9 is a graph showing a bias-voltage dependence of a dielectric constant of Example 3.

FIG. 9 shows the bias-voltage dependence of the dielectric constant of Example 3. The dielectric constant was calculated with the capacitance measured at an AC voltage of an amplitude of 0.1 V and a frequency of 100 kHz. The hysteresis in the bias-voltage dependence indicates that dielectric layer 3 is ferroelectric.

FIG. 10 shows a temperature dependence of the capacitance of Example 3. The capacitance was measured at an AC voltage of an amplitude of 0.1 V and a frequency of 100 kHz. The increase of capacitance with temperature indicates that the Curie temperature is higher than room temperature. Thus, dielectric layer is ferroelectric.

As above-mentioned, bulk $(Ba_{0.44}Sr_{0.56})TiO_3$ is paraelectric at room temperature. Therefore, it can be said that dielectric layer 3 of Example 3 exhibits ferroelectric behavior, even though the bulk material is paraelectric.

Example 4

The capacitors of the present invention can provide large capacitance. Therefore, the area of thin film capacitors in semiconductor devices could be reduced by using the capacitors according to the present invention.

Also, the capacitors of the present invention can provide large $P_r$ and good temperature dependence of $P_r$. Therefore, the area of capacitors in semiconductor devices, e.g., memories having ferroelectric thin film capacitors, could be reduced. Further, since the temperature dependence of $P_r$ is improved by the present invention, the reliability of such the devices could be also improved.

Example 4 is a semiconductor memory device according to the present invention. FIG. 11(a) shows a cross-sectional view of MOS transistors of the semiconductor memory device. FIG. 11(b) shows a plan view of MOS transistors of FIG. 11(a). FIG. 12(a) shows a cross-sectional view of ferroelectric capacitors of the semiconductor memory device. FIG. 12(b) shows a plan view of ferroelectric capacitors of FIG. 12(a). FIG. 13 shows a cross-sectional view of the semiconductor memory device composed of the MOS transistors of FIG. 11(a) and the ferroelectric capacitors of FIG. 11(a).

As depicted in FIGS. 11(a) and (b) semiconductor substrate 11 has MOS transistors isolated by isolation regions 12. For example, semiconductor substrate 11 is a Si substrate and isolation regions 12 are silicon oxide ($SiO_2$).

Each MOS transistor includes a source region 14-1, a drain region 14-2, a gate insulator layer 13-1 and a gate electrode 13-2. For example, source and drain regions 14-1, 14-2 are formed on the surface of substrate 11, and are the opposite conductive type to substrate 11.

Gate insulator layer 13-1, such as silicon oxide or silicon nitride, is formed between source and drain regions 14-1, 14-2 on the surface of substrate 11. Gate electrode 13-2, such as doped polysilicon, is also formed between source and drain regions 14-1, 14-2 on gate insulator layer 13-1.

A bit line 15 is disposed on drain region 14-2 so as to connect plural drain regions 14-2.

A first insulator layer 20 is formed on substrate 11.

Contact regions 10 are buried in first insulator layer 20 corresponding to each source regions 14-1. Contact electrodes 16 are formed on the top of contact regions 10.

Ferroelectric capacitors shown in FIG. 12(a) have the same structure as those described in Example 1. For example, as depicted in FIGS. 12(a) and (b) substrate 1 of (001) single crystal MgO provides a bottom electrode 2 of (001)-oriented Pt.

In other words, substrate 1 and bottom electrode 2 compose a conductive substrate 5.

A dielectric layer 3 (e.g., $(Ba_{0.85}Sr_{0.15})TiO_3$) is formed on bottom electrode 2 shaped into a drive line of this memory device. Upper electrodes 4, such as Ni, are disposed on dielectric layer 3. The placement of upper electrodes 4 is the same as the placement of contact electrodes 16 of FIG. 11(a).

The MOS transistors in FIG. 11(a) and the capacitors in FIG. 12(a) are bonded together. Before bonding, as for transistors in FIG. 11(a), a second insulator layer 21-1 is formed on first insulator layer 20 and contact electrodes 16. After that, second insulator layer 21-1 is polished so that contact electrodes 16 appear with a first flat surface including contact electrodes 16 and second insulator layer 21-1. A third insulator layer 21-2 is formed on dielectric layer 3 and upper electrodes 4. After that, third insulator layer 21-2 is polished so that upper electrodes 4 appear with a second flat surface including upper electrodes 4 and third insulator layer 21-2.

After that, the first flat surface including contact electrodes 16 and second insulator layer 21-1 and the second flat surface including upper electrodes 4 and third insulator layer 21-2 are placed facing each other, and each contact electrode 16 is bonded to each upper electrode 4, for example, by heating. As a result, plural memory cells including one MOS transistor and one ferroelectric capacitor are completed (FIG. 13).

In Example 4, MOS transistors and ferroelectric capacitors are separately produced. However, MOS transistors and ferroelectric capacitors may be formed in one substrate.

U.S. Pat. No. 5,297,077 discloses a structure and an operation of semiconductor memory devices in which the capacitor of the present invention could be applied. One of operations of the present invention will be, for example, described below.

FIG. 14 shows an equivalent circuit of a semiconductor memory device of FIG. 13. One memory cell includes one transistor 24 and one capacitor 25. Plural memory cells are placed in a matrix array.

A gate electrode of transistor 24 is connected to a word line 13 of this memory device. Each word line 13 is connected to plural transistors 24. While a drain electrode (or a source electrode) of transistor 24 is connected to a bit line 15, a drain electrode (or a source electrode) of transistor 24 is connected to capacitor 25. Capacitor 25 is connected to a drive line 22 so that transistor 24 is connected to drive line 22 through capacitor 25.

Word lines 13 are connected to a word line selecting unit 26. Drive lines 22 are connected to a drive line operating unit 27.

In data-writing operation to memory cell $200_n$, word line $13_n$ is activated so that transistor $24_n$ is on. After that, a predetermined voltage V is applied to drive line $22_n$ so that capacitor $25_n$ is polarized in a direction corresponding to "0" or "1". For example, $V=V_d$ for "1" and $V=-V_d$ for "0".

In a data-reading operation from memory cell $200_n$, a predetermined voltage is applied to a couple of bit lines BL, BL' so that the couple of bit lines BL, BL' are precharged. Then, bit lines BL, BL' are floating. After that, word line $13_n$ is activated so that transistor $24_n$ is on. As a result, bit line BL is connected to capacitor $25_n$. At that time, bit line BL' is connected to a reference capacitor (not illustrated). After that, a predetermined voltage is applied to drive line DL. When the polarization of capacitor $25_n$ is reversed, the potential of bit line BL will be higher than when the polarization of capacitor $25_n$ is not reversed. Therefore, if the potential of bit line BL' is set between the potential of bit line BL when reversed and that of when not reversed, the potential of bit line BL is able to be fixed by sense amplifier SA corresponding to the polarization direction of capacitor $25_n$.

Thus, the applied voltage to drive line DL, and the capacitance of the reference capacitor are predetermined so that the potential of bit line BL is able to be fixed by sense amplifier SA corresponding to the polarization direction of capacitor $25_n$.

After reading, rewriting operation will be needed because the stored data is destroyed during reading operation.

The operation about a nonvolatile mode in the U.S. Pat. No. 5,297,077 could be used entirely.

Example 5

Example 5 is a semiconductor memory device according to the present invention. In Example 5, the capacitors are used as normal capacitors, i.e., not using ferroelectric property. However, the structure is substantially the same as Example 4 except that one of electrodes of capacitors 25 is fixed to a voltage.

FIG. 15 shows an equivalent circuit of a semiconductor memory device of Example 5. One memory cell includes one transistor 24 and one capacitor 25. Plural memory cells are placed in a matrix array.

In a data-writing operation to memory cell $200_n$, word line $13_n$ is activated so that transistor $24_n$ is on and capacitor $25_n$ is charged.

In a data-reading operation from memory cell $200_n$, a predetermined voltage is applied to a couple of bit lines BL, BL' so that the couple of bit lines BL, BL' are precharged. Then, bit lines BL, BL' are floating. After that, word line $13_n$ is activated so that transistor $24_n$ is on. As a result, bit line EL is connected to capacitor $25_n$. At that time, bit line BL' is connected to a reference capacitor (not illustrated). When capacitor $25_n$ has been charged, the potential of bit line BL will be higher than when capacitor $25_n$ has not been charged. Therefore, if the potential of bit line BL' is set between the potential of bit line BL when charged and that of when not charged, the potential of bit line BL is able to be fixed by sense amplifier SA corresponding to the charged state of capacitor $25_n$.

Thus, the applied voltage to a couple of bit lines BL, BL', and the capacitance of the reference capacitor are predetermined so that the potential of bit line BL is able to be fixed by sense amplifier SA corresponding to the charged state of capacitor $25_n$.

After reading, rewriting operation will be needed because the stored data is destroyed, during reading operation.

The operation about a volatile mode in the U.S. Pat. No. 5,297,077 could-be used entirely.

Modifications and variations of the present invention are possible in light of the above teachings. It is therefore to be understood that within the scope of the appended claims, the invention may be practiced otherwise than as specifically described herein.

What is claimed is:

1. A capacitor comprising:

a first electrode:

a dielectric layer comprised of a dielectric perovskite material epitaxially deposited on said first electrode, the epitaxially deposited dielectric layer having a single crystal structure, said dielectric perovskite material having an original lattice constant $c_o$, said dielectric layer having a lattice parameter $c_e$ wherein $c_e/c_o$ is 1.02 or more, the thickness of said dielectric layer being 15 nm or more; and a second electrode on the dielectric layer.

2. The capacitor according to claim 1, wherein said dielectric perovskite material consists essentially of $(Ba_xSr_{1-x})TiO_3$, wherein $0.30 \leq x \leq 0.90$.

3. The capacitor according to claim 1, wherein said dielectric layer is ferroelectric.

4. The capacitor according to claim 3, wherein said dielectric perovskite material consists essentially of $(Ba_xSr_{1-x})TiO_3$, wherein $0.30 \leq x \leq 0.70$.

5. A capacitor comprising:

a first electrode, one surface of said electrode being selected from the group consisting of a plane of a cubic material and the (001) plane of a tetragonal material, and said first electrode having a lattice constant $a_s$;

a dielectric material having an original lattice constant $a_o$ and a Curie temperature of 150° C. or less, and said dielectric material being epitaxially deposited as perovskite to form a layer on said first electrode, the epitaxially deposited dielectric layer having a single crystal structure, wherein $1.002 \leq a_o/a_s \leq 1.015$; and a second electrode on said dielectric layer.

6. The capacitor according to claim 5, wherein $c_e/c_o$ is 1.02 or more, wherein $c_o$ is the original lattice constant of said dielectric material and $C_e$ is the lattice parameter of said dielectric layer.

7. The capacitor according to claim 5, wherein said dielectric perovskite material comprises $ABO_3$, where A is at least one of Ba, Sr and Ca, b is at least one of Ti, Zr, Hf, Sn, $(Mg_{1/3}Nb_{2/3})$, $(Mg_{1/3}Ta_{2/3})$, $(Zn_{1/3}Nb_{2/3})$, $(Zn_{1/3}Ta_{2/3})$, $(Mg_{1/2}Te_{1/2})$, $(Co_{1/2}W_{1/2})$, $(Mg_{1/2}W_{1/2})$, $(Mn_{1/2}W_{1/2})$, $(Sc_{1/2}Nb_{1/2})$, $(Mn_{1/2}Nb_{1/2})$, $(Sc_{1/2}Ta_{1/2})$, $(Fe_{1/2}Nb_{1/2})$, $(In_{1/2}Nb_{1/2})$, $(Fe_{1/2}Ta_{1/2})$, $(Cd_{1/3}Nb_{2/3})$, $(Co_{1/3}Nb_{2/3})$, $(N_{1/3}Nb_{2/3})$, $(Co_{1/3}Ta_{2/3})$ and $(Ni_{1/3}Ta_{2/3})$.

8. The capacitor according to claim 5, wherein said first electrode is formed on a structural substrate.

9. The capacitor according to claim 5, wherein said first electrode comprises (001) oriented Pt.

10. The capacitor according to claim 8, wherein said structural substrate has a surface being selected from the group consisting of a plane of a cubic material and the (001) plane of a tetragonal material.

11. The capacitor according to claim 10, wherein said structural substrate comprises a MgO single crystal.

12. The capacitor according to claim 8, wherein the thickness of said first electrode is about 80 nm or less.

13. The capacitor according to claim 5, wherein the thickness of said layer of said dielectric material is about 70 nm or more.

14. A capacitor comprising:

a first electrode, one surface of said first electrode being selected from the group consisting of a plane of a cubic material and the (001) plane of a tetragonal material, and said first electrode having a lattice constant $a_s$;

a dielectric material having an original lattice constant $a_o$ and a Curie temperature of 150° C. or less, and said dielectric material being epitaxially deposited as perovskite to form a layer on said first electrode, the epitaxially deposited dielectric layer having a single crystal structure, wherein $1.992 \leq a_o/a_s \leq 1.015$, said dielectric perovskite material is paraelectric, and said dielectric layer is ferroelectric; and a second electrode on said dielectric layer.

15. A dielectric material for a thin film capacitor, said dielectric material consisting essentially of:

a dielectric material epitaxially deposited on a plane of a crystalline material to form a layer, the epitaxially deposited dielectric layer having a single crystal structure, said dielectric material being paraelectric in bulk form, said dielectric material having induced strain in said layer sufficient to render said layer ferroelectric.

16. The dielectric material according to claim 15, wherein said plane is selected from the group consisting of a plane of a cubic material and the (001) plane of a tetragonal material.

17. A capacitor comprising:

a first electrode, one surface of said electrode layer being selected from the group consisting of a plane of a cubic material and the (001) plane of a tetragonal material, and said first electrode having a lattice constant $a_s$;

a dielectric material having an original lattice constant $a_o$ and consisting essentially of $ABO_3$, where A is at least one of Ba, Sr and Ca, b is at least one of Ti, Zr, Hf, Sn, $(Mg_{1/3}Nb_{2/3})$, $(Mg_{1/3}Ta_{2/3})$, $(Zn_{1/3}Nb_{2/3})$, $(Zn_{1/3}Ta_{2/3})$, $(Mg_{1/2}Te_{1/2})$, $(Co_{1/2}W_{1/2})$, $(Mg_{1/2}W_{1/2})$, $(Mn_{1/2}W_{1/2})$, $(Sc_{1/2}Mb_{1/2})$, $(Mn_{1/2}Nb_{1/2})$, $(SC_{1/2}Ta_{1/2})$, $(Fe_{1/2}Nb_{1/2})$, $(In_{1/2}Nb_{1/2})$, $(Fe_{1/2}Ta_{1/2})$, $(Cd_{1/2}Nb_{2/3})$, $(Co_{1/3}Nb_{2/3})$, $(Ni_{1/3}Nb_{2/3})$, $(Co_{1/3}Ta_{2/3})$ and $(Ni1/3Ta_{2/3})$, and said dielectric material being epitaxially deposited as perovskite to form a layer on said first electrode, the epitaxially deposited dielectric layer having a single crystal structure wherein $1.002 \leq a_o/a_s \leq 1.015$; and a second electrode on said dielectric layer.

18. A semiconductor device comprising:

a transistor; and a capacitor having a first electrode; a dielectric layer of a dielectric perovskite material epitaxially deposited on said first electrode, the epitaxially deposited dielectric layer having a single crystal structure, said dielectric perovskite material having an original lattice constant $c_o$, said dielectric layer having a lattice parameter $c_o$, wherein $c_o/c_o$ is about 1.02 or more; and a second electrode on the dielectric layer.

19. A semiconductor memory device comprising:

a plurality of memory cells, each of said cells including a transistor and a capacitor, said capacitor having a first electrode; a dielectric layer of a dielectric perovskite material epitaxially deposited on said first electrode, the epitaxially deposited dielectric layer having a single crystal structure, said dielectric perovskite material having an original lattice constant $c_o$, said dielectric layer having a lattice parameter $c_o$, wherein $c_o/c_o$ is about 1.02 or more; and a second electrode on the dielectric layer;

a data writer for writing data into said capacitor; and a data reader for reading data from said capacitor.

20. A process of improving the dielectric properties of a perovskite material, said process comprising the steps of:

providing a crystalline surface;

depositing said perovskite material epitaxially to form a dielectric layer on said crystalline surface, the epitaxially deposited dielectric layer having a single crystal structure, said perovskite material being paraelectric in bulk form, said crystalline surface and said perovskite material having sufficiently different lattice parameters such that sufficient strain is induced in said dielectric layer to render said dielectric layer ferroelectric.

* * * * *

UNITED STATES PATENT AND TRADEMARK OFFICE
CERTIFICATE OF CORRECTION

PATENT NO. : 5,760,432
DATED : June 02, 1998
INVENTOR(S) : Kazuhide ABE et al.

It is certified that error appears in the above-identified patent and that said Letters Patent is hereby corrected as shown below:

Claim 6, column 12, line 54, "Ce" should read --$c_e$--.

Claim 14, column 13, line 22, " 1.992" should read --1.002--.

Claim 17, column 14, line 2, "($SC_{1/2}Ta_{1/2}$)" should read --($Sc_{1/2}Ta_{1/2}$)--.

Claim 17, column 14, line 4, "($Ni1/3Ta_{2/3}$)" should read --($Ni_{1/3}Ta_{2/3}$)--.

Claim 17, column 14, line 8, after "structure", insert --,--.

Claim 19, column 14, line 29, "parameter $c_o$" should read --parameter $c_e$--

Signed and Sealed this

Sixteenth Day of March, 1999

*Attest:*

*Attesting Officer*

Q. TODD DICKINSON

*Acting Commissioner of Patents and Trademarks*